(12) United States Patent
Lingambudi et al.

(10) Patent No.: US 10,902,887 B2
(45) Date of Patent: Jan. 26, 2021

(54) MEMORY SUBSYSTEM POWER MANAGEMENT

(71) Applicant: International Business Machines Corporation, Armonk, NY (US)

(72) Inventors: Anil Bindu Lingambudi, Bangalore (IN); Arindam Raychaudhuri, Bangalore (IN); Diyanesh B. Chinnakkonda Vidyapoornachary, Bangalore (IN)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 54 days.

(21) Appl. No.: 16/202,233

(22) Filed: Nov. 28, 2018

(65) Prior Publication Data

US 2020/0168255 A1  May 28, 2020

(51) Int. Cl.
*G06F 12/00* (2006.01)
*G11C 5/14* (2006.01)
*G06F 3/06* (2006.01)

(52) U.S. Cl.
CPC ............ *G11C 5/147* (2013.01); *G06F 3/0604* (2013.01); *G06F 3/0659* (2013.01); *G06F 3/0673* (2013.01)

(58) Field of Classification Search
None
See application file for complete search history.

(56) References Cited

U.S. PATENT DOCUMENTS

| 9,244,519 | B1 | 1/2016 | Ellis et al. |
| 9,606,595 | B2 | 3/2017 | Varma et al. |
| 9,740,267 | B1 | 8/2017 | Cordero et al. |
| 2006/0129853 | A1 | 6/2006 | Schnepper |
| 2015/0185797 | A1 | 7/2015 | Cooper et al. |
| 2016/0111958 | A1 | 4/2016 | Choi et al. |
| 2017/0300263 | A1 | 10/2017 | Helmick |

*Primary Examiner* — Jason W Blust
(74) *Attorney, Agent, or Firm* — Cantor Colburn LLP; Jason Sosa

(57) ABSTRACT

Embodiments of the present invention include detecting one or more memory modules coupled to a memory controller via a memory channel. A total power requirement for the one or more memory modules is determined. A voltage regulator module set point of the memory channel is adjusted based at least in part on the power requirement for the one or more memory modules. The voltage regulator module provides power to the memory modules and is characterized by an optimal load current value where the voltage regulator module operates at a peak efficiency. An operating mode of the memory controller is determined. Based on determining that the memory controller is operating in a first mode, the commands serviced by the one or more memory modules are throttled by the memory controller to keep a load current of the memory channel within a range of the optimal load current value.

20 Claims, 8 Drawing Sheets

MEMORY SUBSYSTEM POWER MANAGEMENT

BACKGROUND

Embodiments of the present invention relate in general to computer memory, and more specifically to providing memory subsystem power management.

Increasing memory capacity and technology advancements continue to push memory subsystem power requirements significantly. Growing memory density, especially with shrinking technology nodes and three-dimensional (3D) technology integration have caused power and thermal challenges. During server development, the memory subsystem performance, power, and thermal limits are verified for all supported configurations. Memory modules, such as dual inline memory modules (DIMMs), from multiple vendors are characterized and qualified. Memory module vendors typically design memory DIMMs with the latest technology nodes (die levels) and packaging. These newly designed memory modules are characterized and qualified and released to market for customer use.

Though having a wide range of supported DIMMs for customers to utilize in a server is an excellent design feature, the power delivery infrastructure has to deliver useful power, across all supported configurations. Traditional power delivery schemes use a voltage regulator module (VRM) to deliver power to all DIMMs grouped under a memory controller channel. VRMs are typically implemented by hardware that is fixed on a motherboard of the server. A VRM is designed to deliver power for all different capacities of DIMMs (e.g., 8 gigabyte or "GB", 16 GB, 64 GB, 128 GB, 512 GB, etc.). VRMs operate at their maximum efficiency for a narrow set of load ranges causing a variation VRM in efficiency across different memory module configurations.

SUMMARY

Embodiments of the present invention include methods, systems, and computer program products for memory subsystem power management. A non-limiting example method includes detecting one or more memory modules coupled to a memory controller via a memory channel. A total power requirement for the one or more memory modules on the memory channel is determined. A voltage regulator module set point of the memory channel is adjusted based at least in part on the power requirement for the one or more memory modules. The voltage regulator module provides power to the one or more memory modules on the channel and is characterized by an optimal load current value where the voltage regulator module operates at a peak efficiency. An operating mode of the memory controller is determined. Based at least in part on determining that the memory controller is operating in a first mode, the commands serviced by the one or more memory modules are throttled to keep a load current of the memory channel within a range of the optimal load current value. The throttling is performed by the memory controller.

Additional features and advantages are realized through the techniques of the present invention. Other embodiments and aspects of the invention are described in detail herein and are considered a part of the claimed invention. For a better understanding of the invention with the advantages and the features, refer to the description and to the drawings.

BRIEF DESCRIPTION OF THE DRAWINGS

The specifics of the exclusive rights described herein are particularly pointed out and distinctly claimed in the claims at the conclusion of the specification. The foregoing and other features and advantages of the embodiments of the invention are apparent from the following detailed description taken in conjunction with the accompanying drawings in which:

The diagrams depicted herein are illustrative. There can be many variations to the diagram or the operations described therein without departing from the spirit of the invention. For instance, the actions can be performed in a differing order or actions can be added, deleted or modified. Also, the term "coupled" and variations thereof describes having a communications path between two elements and does not imply a direct connection between the elements with no intervening elements/connections between them. All of these variations are considered a part of the specification.

In the accompanying figures and following detailed description of the disclosed embodiments, the various elements illustrated in the figures are provided with two or three digit reference numbers. With minor exceptions, the leftmost digit(s) of each reference number correspond to the figure in which its element is first illustrated.

DETAILED DESCRIPTION

One or more embodiments of the present invention provide efficient power delivery to a memory subsystem irrespective of the capacities of the memory modules. The memory subsystem power management provided by one or more embodiments of the present invention aims to achieve maximum power efficiency, independent of the memory modules in terms of capacity and configurations. One or more embodiments of the present invention detect the memory modules plugged under, or communicatively coupled to, a memory controller channel by reading vital product data (VPD). A total power requirement is determined for all of the memory modules under the memory controller channel. A set point of a voltage regulator module (VRM) providing power to the memory channel is adjusted based on the computed load so that the VRM operates at its highest efficiency. The detecting, determining a total power requirement, and adjusting a set point of a VRM is performed for each memory controller channel in a system.

Figure 1:
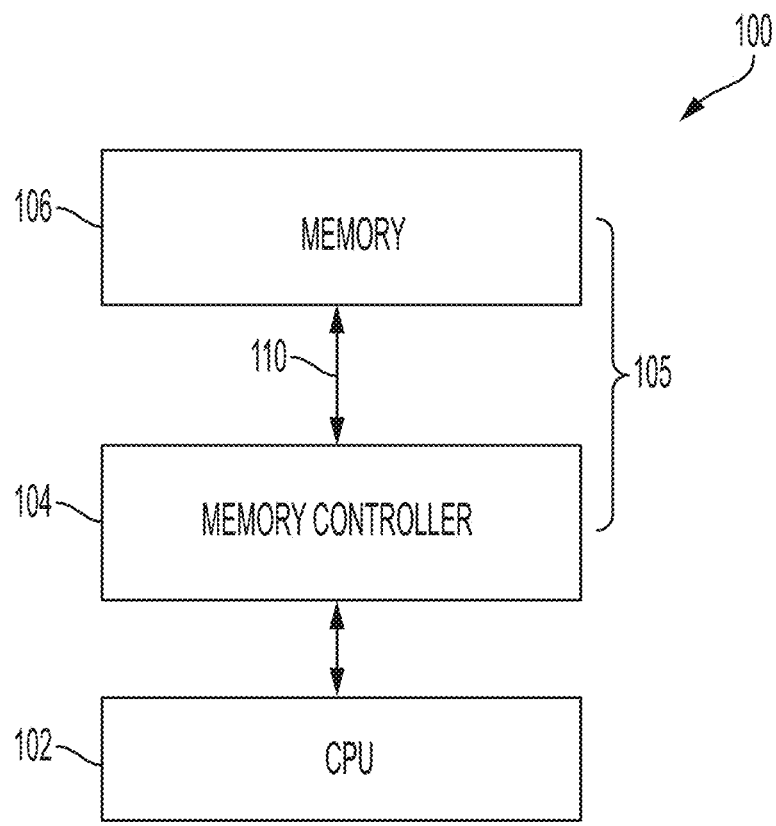
FIG. 1 is a block diagram of an exemplary system that supports memory subsystem power management in accordance with one or more embodiments of the present invention.

Turning now to FIG. 1, a block diagram of system 100 that supports memory subsystem power management is generally shown in accordance with one or more embodiments of the present invention. The system 100 depicted in FIG. 1 includes a computer processor 102, a memory module 106, such as a dual in-line memory module (DIMM) including multiple memory devices (e.g., DRAMs), and a memory controller 104 for reading and storing data in the memory module 106 via a memory controller channel 110. Collectively, the memory controller 104 and the memory 106 are referred to herein as the memory subsystem 105. In accordance with one or more embodiments of the present invention, the memory controller 104 is physically located on the memory module 106. The computer processor 102 can be a single core or multi-core processor. In one or more embodiments the memory controller 104 is coupled to the computer processor 102 and receives read or write requests from the computer processor 102.

The system 100 is one example of a configuration that may be utilized to perform the processing described herein. Although the system 100 has been depicted with only a memory module 106, memory controller 104, and computer processor 102, it will be understood that other embodiments would also operate in other systems including additional elements, e.g., multiple computers processors 102, multiple memory controllers 104, and multiple memory modules 106. In an embodiment, the memory module 106, memory controller 104, and computer processor 102 are not located within the same computer. For example, the memory module 106 and memory controller 104 may be located in one physical location while the computer processor 102 is located in another physical location (e.g., the computer processor 102 accesses the memory controller 104 via a network). In addition, portions of the processing described herein may span one or more of the memory module 106, memory controller 104, and computer processor 102.

Figure 2:
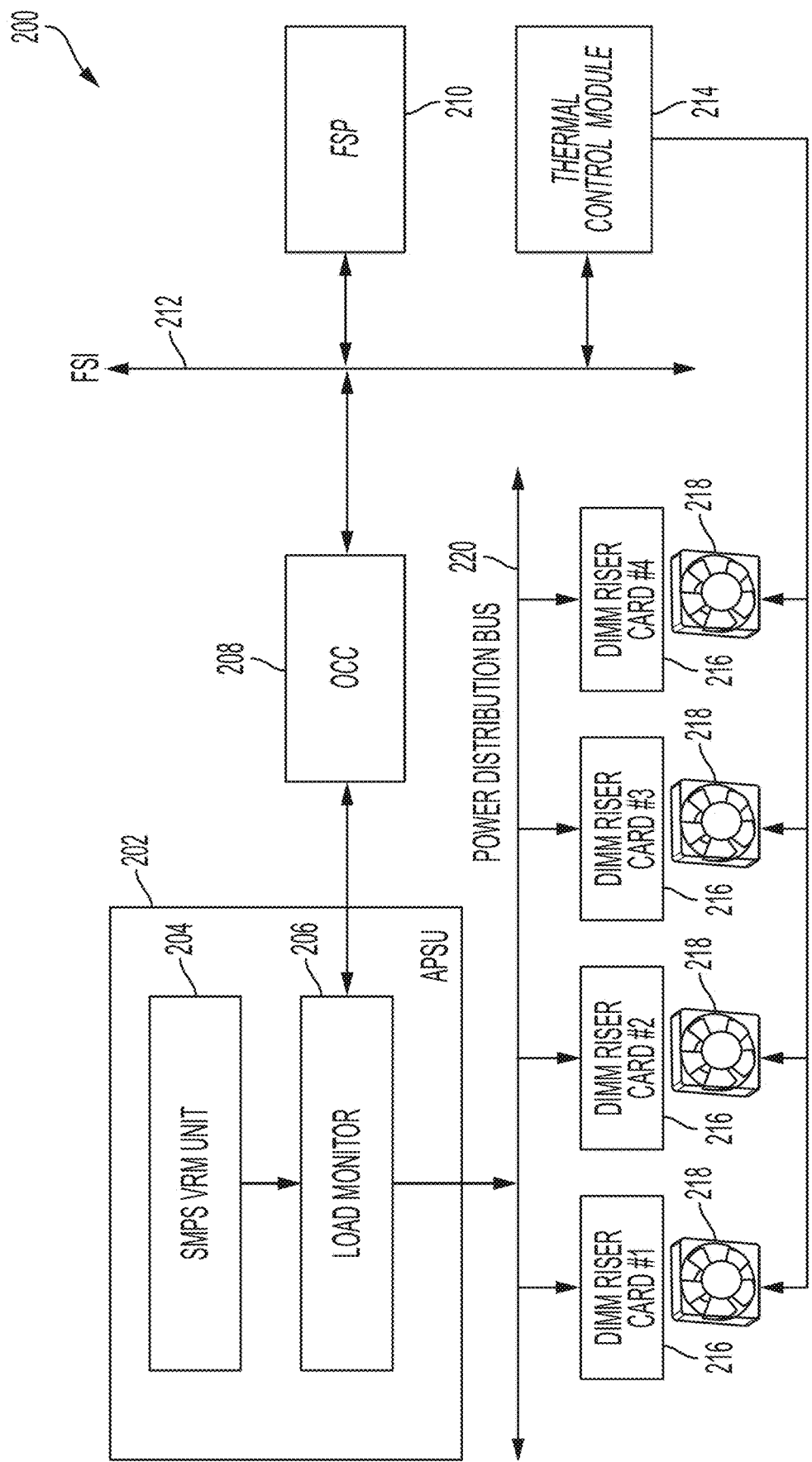
FIG. 2 is a block diagram of a power management architecture in accordance with one or more embodiments of the present invention.

Turning now to FIG. 2, a block diagram of a power management architecture 200 is generally shown in accordance with one or more embodiments of the present invention. The power management architecture 200 shown in FIG. 2 includes an analog power supply unit (APSU) 202, an on-chip controller (OCC) 208, a power distribution bus 220, a plurality of DIMMs 216, a plurality of fans 218, a field service interface (FSI) bus 212, a flexible service processor (FSP) 210, and a thermal control module 214. In accordance with one or more embodiments of the present invention, a memory controller is located on each of the DIMMs 216. Also as shown in FIG. 2, the APSU 202 includes a switched mode power supply voltage regulator module (SMPS VRM) unit 204 and a load monitor unit 206. FSP 210 handles the firmware (FW) and controls all the hardware (HW) on the processor system. FSP 210 communicates with main processor, memory, IO, power subsystem, OCC through the FSI bus 212. The APSU unit supply power to DIMM cards. The thermal control module controls the temperature of the memory subsystem by operating fans based on DIMM load condition. The OCC interacts with APSU and FSP for efficient power management of DIMMs.

Figure 3:
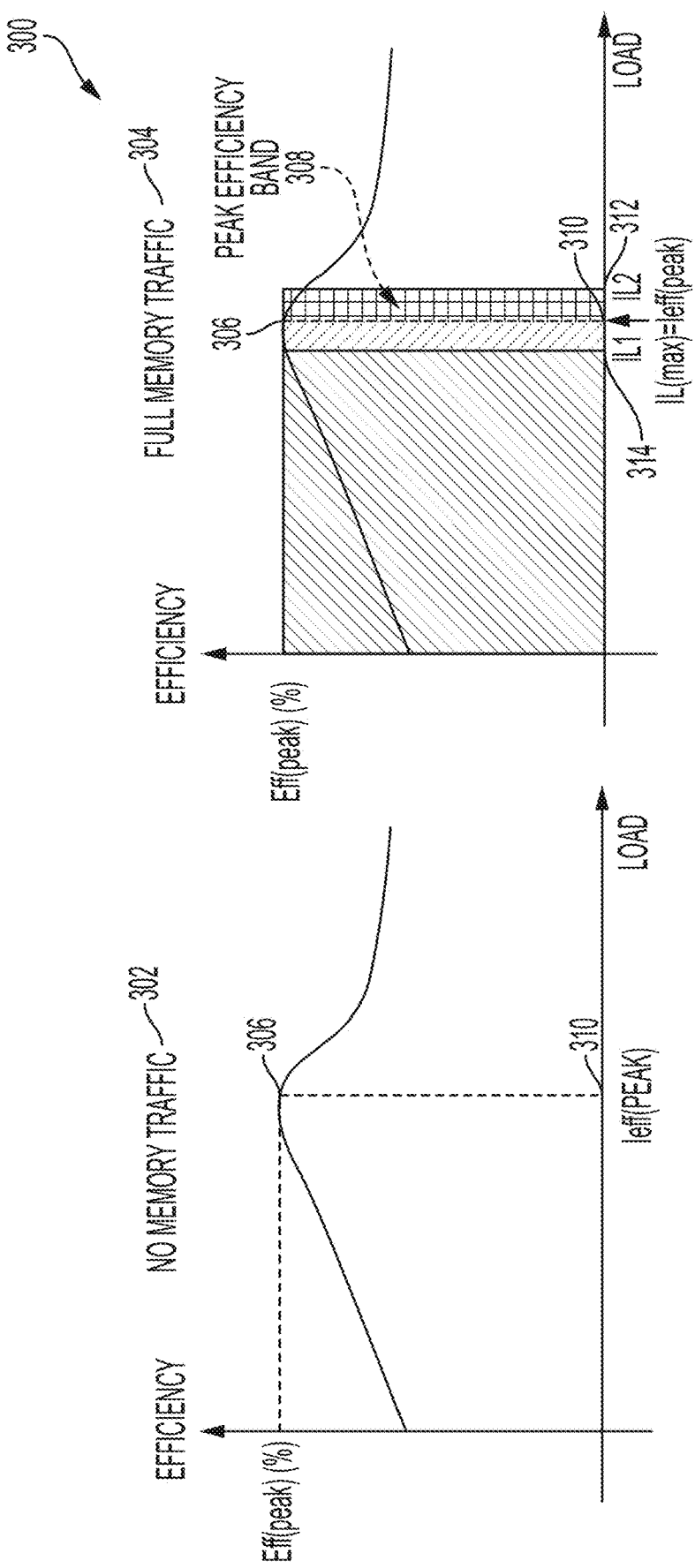
FIG. 3 depicts diagrams that illustrate limiting memory bandwidth for optimized energy in accordance with one or more embodiments of the present invention.

Turning now to FIG. 3, diagrams 300 that illustrate limiting memory bandwidth for optimized energy are generally shown in accordance with one or more embodiments of the present invention. The vertical axis of diagram 302 and diagram 304 represents the efficiency of a VRM which can be measured as power output from the VRM divided by the power output from the VRM plus the power loss by the VRM (i.e., output/(output+loss)). The horizontal axis of diagram 302 and diagram 304 represent the load, or load current being drawn from the VRM by the memory modules in the memory channel.

The embodiment shown in FIG. 3 can be utilized to deliver memory subsystem power at its highest efficiency possible (i.e., minimum possible regulator power loss) when the memory subsystem is operating an optimized load traffic conditions. During the IPL of the system, the following memory voltage regulator procedures are performed. For all of the memory channels in the memory subsystem the load current versus efficiency curve of all memory voltage configurations under a memory voltage regulator module (VRM) are read, for example from vital product data (VPD). For each memory module under the memory channel, the load current of the VRM that is delivered at peak efficiency is determined. This is shown in diagram 302 and diagram 304 as load efficiency peak or "Ieff(peak)" 310. This load at Ieff(peak) 310 is the load where the VRM operates at its peak efficiency or "eff(peak) 306. A throttle threshold limit of the memory controller is programmed to limit a maximum load or "IL(max)" to be equal to Ieff(peak) 310. The system proceeds with the rest of the IPL boot flow to realize the above mentioned memory subsystem settings to achieve energy conservation.

In accordance with the embodiment shown in FIG. 3, the memory controller throttles a number of memory commands serviced by the memory modules coupled to the memory channel to keep the VRM at its peak efficiency. As shown in diagram 304, the memory commands are throttled to the load (IL) on the VRM between "IL1" and "IL2" which represents a peak efficiency band 308 around Ieff(peak) 310. The values of IL1 and IL2 (i.e., the width of the peak efficiency band 308) can be modified based on implementation requirements. Then the memory controller is operating in this optimized energy mode, when IL is greater than IL2 312, the memory controller applies a throttle to reduce load power below IL2 312. In addition, when IL is less than IL1, the memory controller withdraws, or reduces, the throttle to run the PSU within the peak efficiency band 308.

A technical benefit of implementing the embodiment shown in FIG. 3 is energy conservation because the power that is delivered is utilized at its maximum efficiency due to very minimum power loss in the VRM. Another technical benefit is that the power is capped which reduces the overall bulk power limit of the overall system. This can be due to at least two facets of the above embodiment, first that the memory power is dynamically capped and second that the power wastage due to VRM inefficiency is eliminated. Dynamically capping the memory power can limit the fan speeds, resulting in the fans using less power. A downside to the embodiment shown in FIG. 3 is that the traffic to the memory module is capped and this may impact memory performance when memory commands are throttled during full load traffic conditions.

Figure 4:
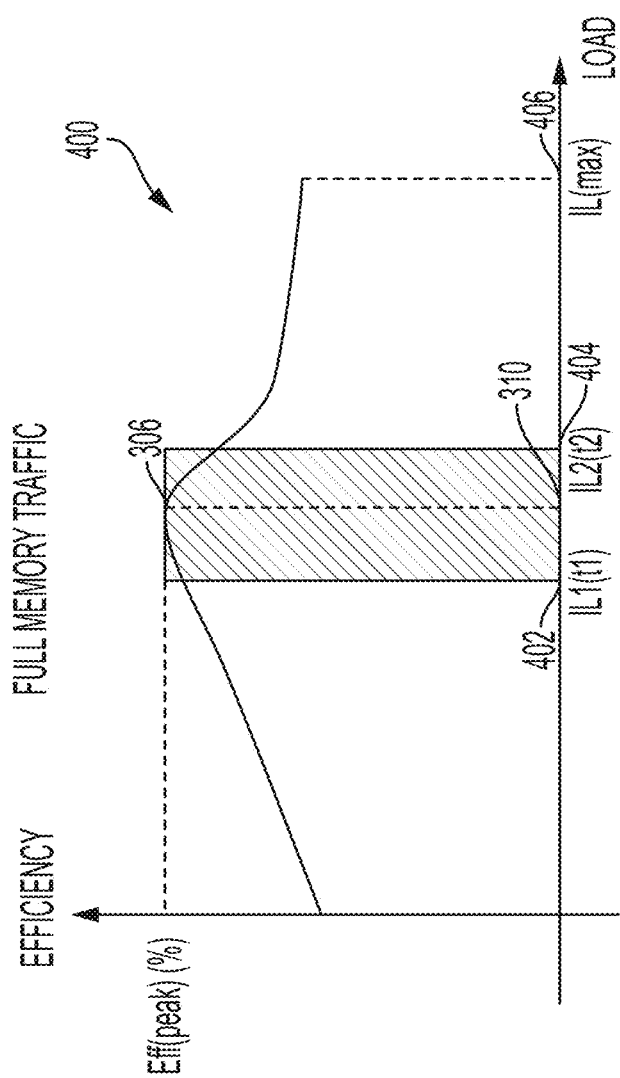
FIG. 4 depicts a diagram that illustrates an adaptive learning approach for optimized performance and energy efficiency in accordance with one or more embodiments of the present invention.

Turning now to FIG. 4, a diagram 400 that illustrates an adaptive learning approach for optimized performance and energy efficiency is generally shown in accordance with one or more embodiments of the present invention. In the embodiment shown in FIG. 4, when full load traffic conditions are encountered, or workload demanding highest performance, the memory controller enters a maximum performance mode and does not throttle the memory commands to keep the VRM at its peak efficiency as described above with respect to FIG. 3. In the embodiment shown in FIG. 4, for bursty and/or intermittent workload traffic, the memory controller enters an energy optimizing mode. As shown in FIG. 4, IL(t1) 402 and IL(t2) 404 create a maximum regulator efficiency window (hysteresis) around Ieff(peak) 310, and IL(max) 406 is the maximum load current.

In accordance with the embodiment shown in FIG. 4, the energy optimizing mode of the memory controller is optimized for energy and the memory controller throttle will cap traffic to the IL(t2) 404 level; and the maximum performance mode of the memory controller is optimized for memory performance and the memory controller throttling will be removed to achieve maximum traffic throughput.

A technical benefit of this approach is that it allows the fullest bandwidth utilization, based on workload demands. In addition, the energy optimized mode allows achievement of maximum VRM efficiency for bursty/intermittent workloads.

Figure 5:
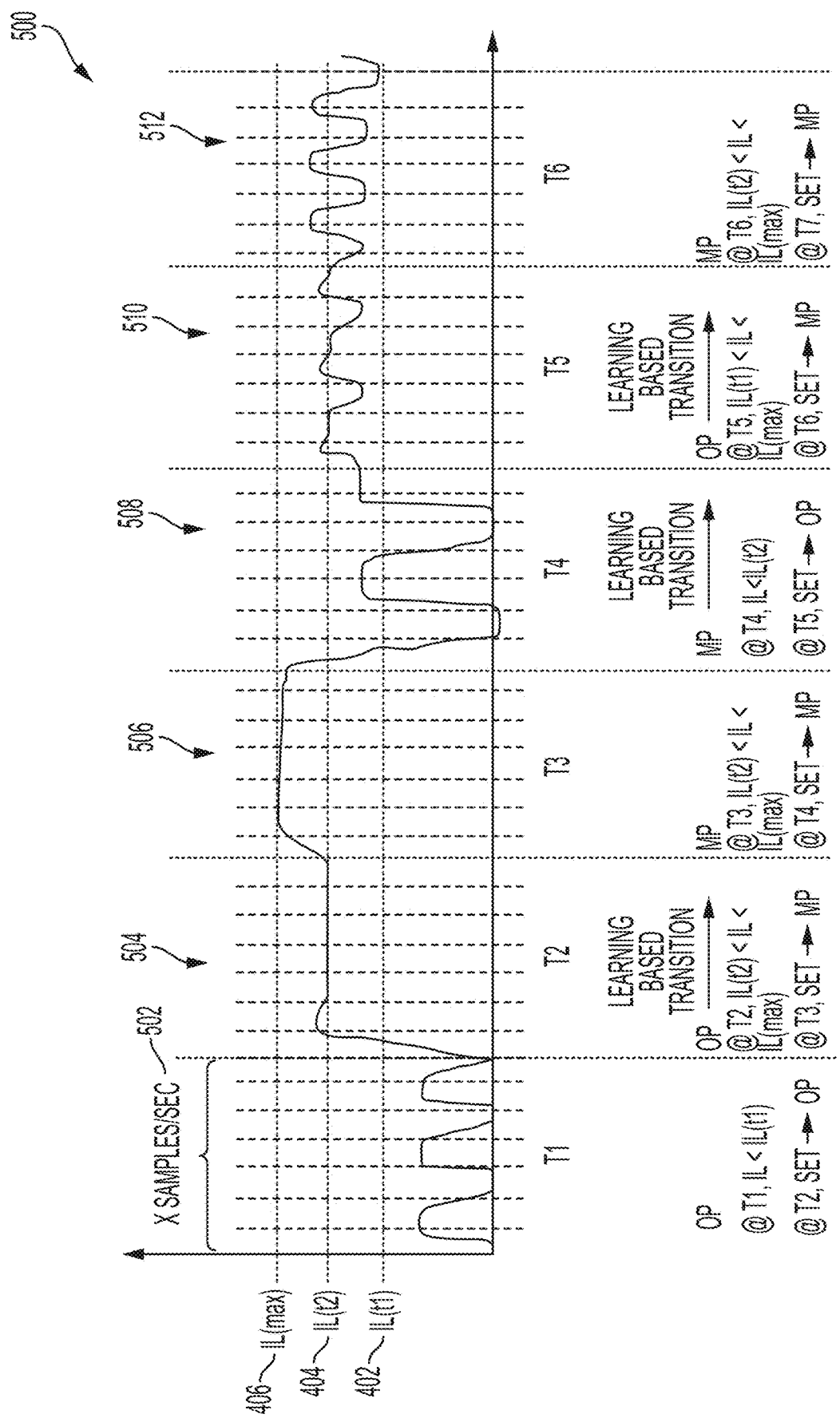
FIG. 5 is a diagram that illustrates sampling data in an adaptive learning approach for optimized performance and energy efficiency in accordance with one or more embodiments of the present invention.

Turning now to FIG. 5, a diagram 500 that illustrates sampling load current data in pre-defined time intervals in an adaptive learning approach for optimized performance and energy efficiency is generally shown in accordance with one or more embodiments of the present invention. The duration of the time intervals and the number of sampling points are set during IPL sequence. The sampling shown in FIG. 5 is used to determine whether the memory controller should operate in the maximum performance (MP) mode or optimized energy (OP) mode described above with respect to FIG. 4. The diagram 500 in FIG. 5 includes a plurality of time intervals T1 502 through T6 512 where load current(s) are measured, the values of the load currents are compared to IL(max) 406, IL(t2) 404, and IL(t1), and based on these comparisons, the operating mode (MP→maximum power, less efficiency or OP→lesser power, maximum efficiency) of the memory controller is determined. In this manner, the modes and memory subsystem power management is performed in an adaptive and dynamic manner based on observed traffic in the memory subsystem.

As shown in FIG. 5, at each interval, "x" points are sampled to measure load current (traffic). If [IL<IL(t1) 402] (or) [IL<IL(t2) 404] is observed, then the memory controller is set OP mode in the next interval. If [IL(t2) 404<IL<IL (max) 406], then the memory controller is set to MP mode in the next interval. As shown in FIG. 5, during time interval T1 502 the load current samples are all below IL(t1) and the memory controller stays in OP mode in time interval T2 504. Based on the load current samples taken during time interval T2 504, the memory controller is set to the MP mode at the start of time interval T3 506. Based on the load current samples taken during time interval T3 506, the memory controller remains in the MP mode at the start of time interval T4 508. Based on the load current samples taken during time interval T4 508, the memory controller is set to the OP mode at the start of time interval T5 510. Based on the load current samples taken during time interval T5 510, the memory controller is set to the MP mode at the start of time interval T6 512.

Figure 6:
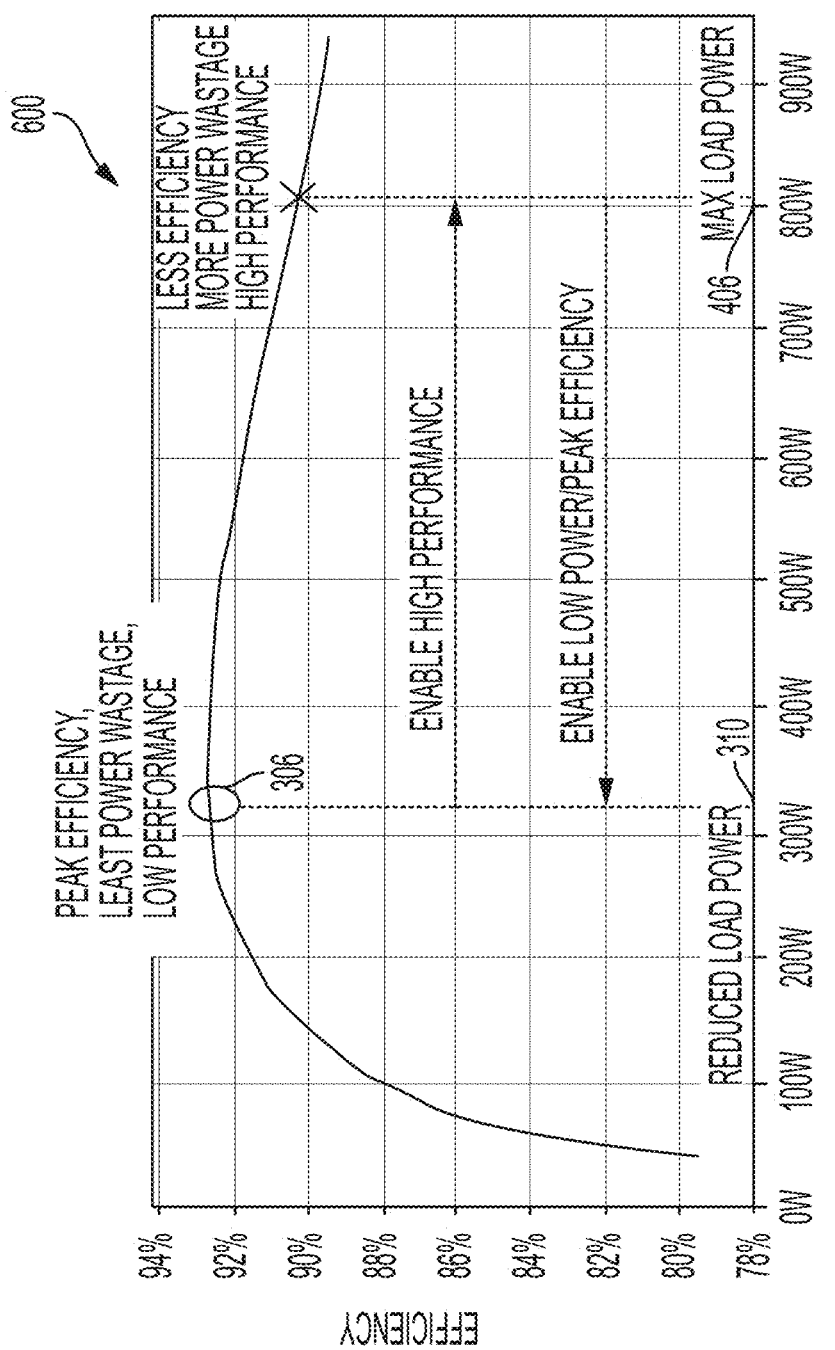
FIG. 6 is a diagram that illustrates switched mode power supply (SMPS) efficiency versus load variation in accordance with one or more embodiments of the present invention.

Turning now to FIG. 6, a diagram 600 that illustrates switched mode power supply (SMPS) efficiency versus load variation is generally shown in accordance with one or more embodiments of the present invention. When the memory subsystem operates in maximum efficiency mode (OP) 306, SMPS operates at its peak efficiency with least power wastage and lower memory performance. In maximum performance mode (MP) 406, SMPS operates at reduced efficiency with increased power wastage but at peak memory performance.

Figure 7:
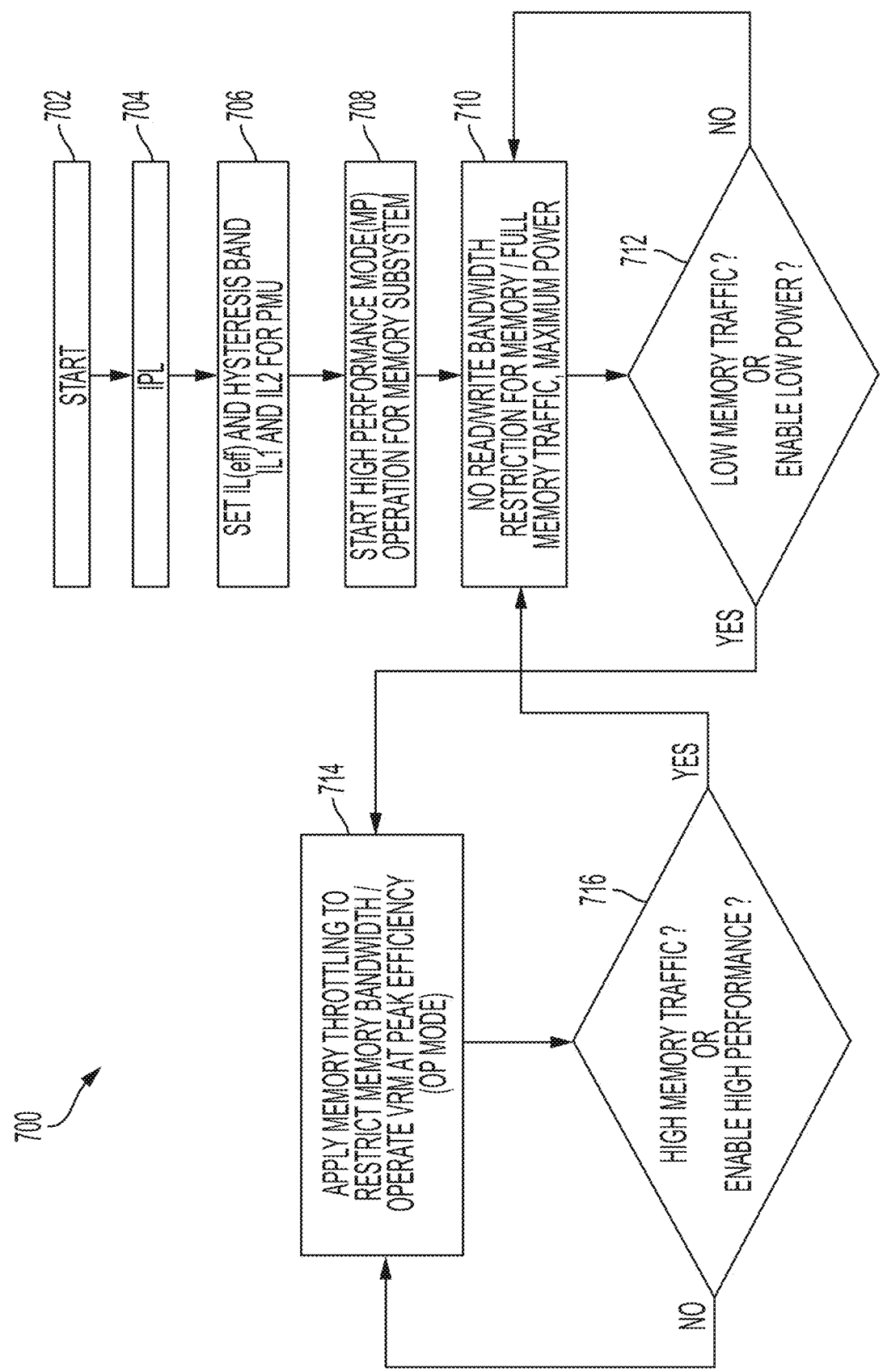
FIG. 7 is a flow diagram of a process for performing an adaptive learning approach for optimized performance and energy efficiency in accordance with one or more embodiments of the present invention.

Turning now to FIG. 7, a flow diagram 700 of a process for performing an adaptive learning approach for optimized performance and energy efficiency is generally shown in accordance with one or more embodiments of the present invention. The processing shown in FIG. 7 can be performed by logic executing on a memory controller in a memory subsystem. The processing starts at block 702 and at block 704 and IPL of the memory subsystem is performed. At block 706, IL(eff) is set, as well as hysteresis band IL1 and IL2 for memory power management unit, APSU. At block 708, the memory controller is set to MP mode, and at block 710, the memory controller operates without any throttling. Processing continues at block 712 where it is determined whether the observed memory traffic in the previous time interval(s) is low memory traffic. If the observed memory traffic is not low memory traffic then processing continues at block 710 without any throttling. If it is determined at block 712 that the memory traffic is low memory traffic, then processing continues at block 714 and the memory controller enters OP mode. In OP mode, the memory controller throttles the memory traffic to restrict the memory bandwidth so that the VRM operates at peak efficiency. Processing continues at block 716 where it is determined whether the observed memory traffic in the previous time interval(s) is high memory traffic. If the observed memory traffic is not high memory traffic then processing continues at block 714 with the memory controller applying throttling as needed. If it is determined at block 716 that the memory traffic is high memory traffic, then processing continues at block 710 and the memory controller enters MP mode.

Figure 8:
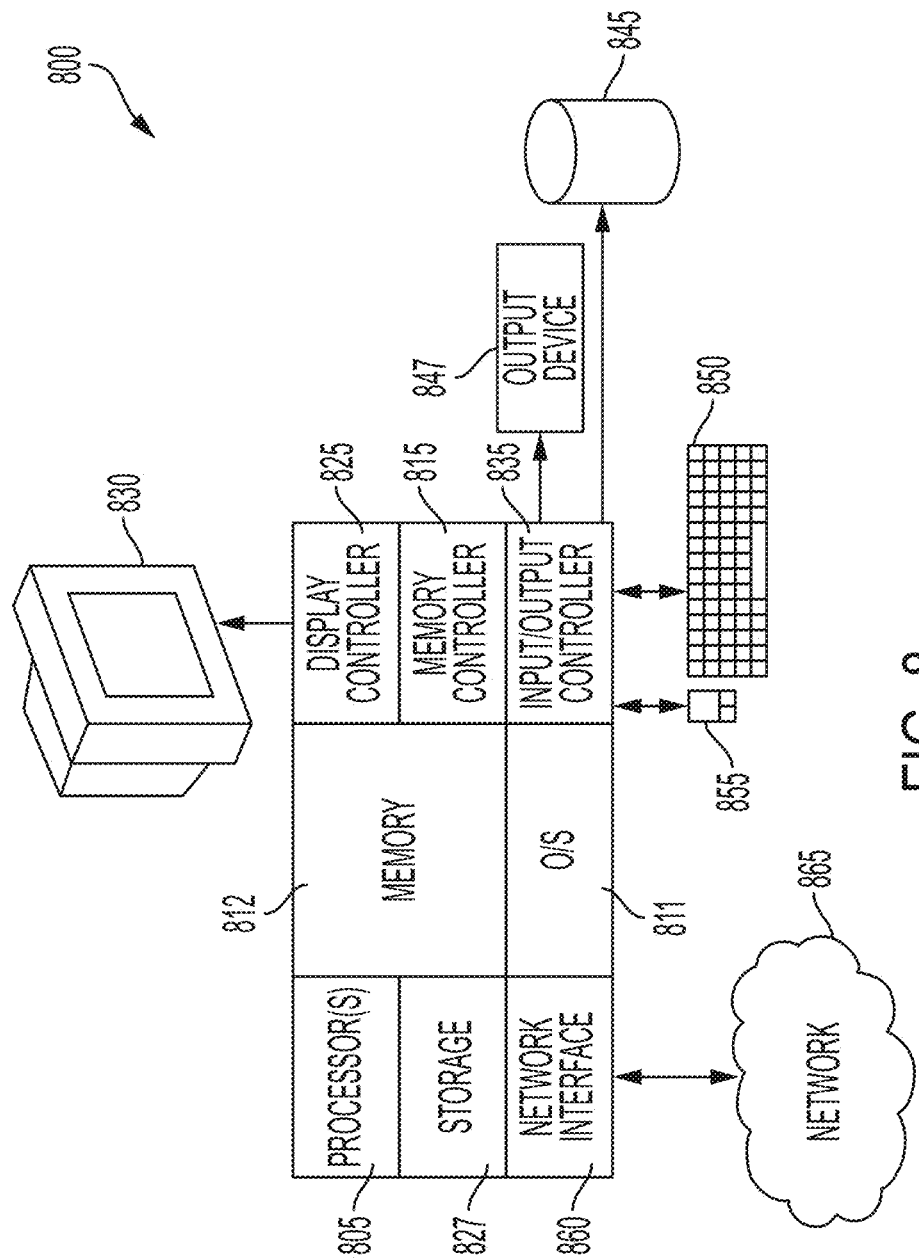
FIG. 8 is a block diagram of a computer system for implementing some or all aspects of providing memory subsystem power management in accordance with one or more embodiments of the present invention.

Turning now to FIG. 8, a block diagram of a computer system 800 for implementing some or all aspects of providing memory subsystem power management is generally shown in accordance with one or more embodiments of the present invention. The processing described herein may be implemented in hardware, software (e.g., firmware), or a combination thereof. In an exemplary embodiment, the methods described may be implemented, at least in part, in hardware and may be part of the microprocessor of a special or general-purpose computer system 800, such as a mobile device, personal computer, workstation, minicomputer, or mainframe computer.

In an exemplary embodiment, as shown in FIG. 8, the computer system 800 includes a processor 805, memory 812 coupled to a memory controller 815, and one or more input devices 845 and/or output devices 847, such as peripherals that are communicatively coupled via a local I/O controller 835. These devices 847 and 845 may include, for example, a printer, a scanner, a microphone, and the like. A conventional keyboard 850 and mouse 855 may be coupled to the I/O controller 835. The I/O controller 835 may be, for example, one or more buses or other wired or wireless connections, as are known in the art. The I/O controller 835 may have additional elements, which are omitted for simplicity, such as controllers, buffers (caches), drivers, repeaters, and receivers, to enable communications.

The I/O devices 847, 845 may further include devices that communicate both inputs and outputs, for instance disk and tape storage, a network interface card (NIC) or modulator/demodulator (for accessing other files, devices, systems, or a network), a radio frequency (RF) or other transceiver, a telephonic interface, a bridge, a router, and the like.

The processor 805 is a hardware device for executing hardware instructions or software, particularly those stored in memory 812. The processor 805 may be a custom made or commercially available processor, a central processing unit (CPU), an auxiliary processor among several processors associated with the computer system 800, a semiconductor based microprocessor (in the form of a microchip or chip set), a microprocessor, or other device for executing instructions. The processor 805 can include a cache such as, but not limited to, an instruction cache to speed up executable instruction fetch, a data cache to speed up data fetch and store, and a translation look-aside buffer (TLB) used to speed up virtual-to-physical address translation for both executable instructions and data. The cache may be organized as a hierarchy of more cache levels (L1, L2, etc.).

The memory 812 may include one or combinations of volatile memory elements (e.g., random access memory, RAM, such as DRAM, SRAM, SDRAM, etc.) and nonvolatile memory elements (e.g., ROM, erasable programmable read only memory (EPROM), electronically erasable programmable read only memory (EEPROM), programmable read only memory (PROM), tape, compact disc read only memory (CD-ROM), disk, diskette, cartridge, cassette or the like, etc.). Moreover, the memory 812 may incorporate electronic, magnetic, optical, or other types of storage media. Note that the memory 812 may have a distributed architecture, where various components are situated remote from one another but may be accessed by the processor 805.

The instructions in memory 812 may include one or more separate programs, each of which comprises an ordered listing of executable instructions for implementing logical functions. In the example of FIG. 8, the instructions in the memory 812 include a suitable operating system (OS) 811. The operating system 811 essentially may control the execution of other computer programs and provides scheduling, input-output control, file and data management, memory management, and communication control and related services.

Additional data, including, for example, instructions for the processor 805 or other retrievable information, may be stored in storage 827, which may be a storage device such as a hard disk drive or solid state drive. The stored instructions in memory 812 or in storage 827 may include those enabling the processor to execute one or more aspects of the dispatch systems and methods of this disclosure.

The computer system 800 may further include a display controller 825 coupled to a display 830. In an exemplary embodiment, the computer system 800 may further include a network interface 860 for coupling to a network 865. The network 865 may be an IP-based network for communication between the computer system 800 and an external server, client and the like via a broadband connection. The network 865 transmits and receives data between the computer system 800 and external systems. In an exemplary embodiment, the network 865 may be a managed IP network administered by a service provider. The network 865 may be implemented in a wireless fashion, e.g., using wireless protocols and technologies, such as WiFi, WiMax, etc. The network 865 may also be a packet-switched network such as a local area network, wide area network, metropolitan area network, the Internet, or other similar type of network environment. The network 865 may be a fixed wireless network, a wireless local area network (LAN), a wireless wide area network (WAN) a personal area network (PAN), a virtual private network (VPN), intranet or other suitable network system and may include equipment for receiving and transmitting signals.

Systems and methods for providing memory subsystem power management as described herein can be embodied, in whole or in part, in computer program products or in computer systems 800, such as that illustrated in FIG. 8.

Various embodiments of the invention are described herein with reference to the related drawings. Alternative embodiments of the invention can be devised without departing from the scope of this invention. Various connections and positional relationships (e.g., over, below, adjacent, etc.) are set forth between elements in the following description and in the drawings. These connections and/or positional relationships, unless specified otherwise, can be direct or indirect, and the present invention is not intended to be limiting in this respect. Accordingly, a coupling of entities can refer to either a direct or an indirect coupling, and a positional relationship between entities can be a direct or indirect positional relationship. Moreover, the various tasks and process steps described herein can be incorporated into a more comprehensive procedure or process having additional steps or functionality not described in detail herein.

The following definitions and abbreviations are to be used for the interpretation of the claims and the specification. As used herein, the terms "comprises," "comprising," "includes," "including," "has," "having," "contains" or "containing," or any other variation thereof, are intended to cover a non-exclusive inclusion. For example, a composition, a mixture, process, method, article, or apparatus that comprises a list of elements is not necessarily limited to only those elements but can include other elements not expressly listed or inherent to such composition, mixture, process, method, article, or apparatus.

Additionally, the term "exemplary" is used herein to mean "serving as an example, instance or illustration." Any embodiment or design described herein as "exemplary" is not necessarily to be construed as preferred or advantageous over other embodiments or designs. The terms "at least one" and "one or more" may be understood to include any integer number greater than or equal to one, i.e. one, two, three, four, etc. The terms "a plurality" may be understood to include any integer number greater than or equal to two, i.e. two, three, four, five, etc. The term "connection" may include both an indirect "connection" and a direct "connection."

The terms "about," "substantially," "approximately," and variations thereof, are intended to include the degree of error associated with measurement of the particular quantity based upon the equipment available at the time of filing the application. For example, "about" can include a range of ±8% or 5%, or 2% of a given value.

For the sake of brevity, conventional techniques related to making and using aspects of the invention may or may not be described in detail herein. In particular, various aspects of computing systems and specific computer programs to implement the various technical features described herein are well known. Accordingly, in the interest of brevity, many conventional implementation details are only mentioned briefly herein or are omitted entirely without providing the well-known system and/or process details.

The present invention may be a system, a method, and/or a computer program product. The computer program product may include a computer readable storage medium (or media) having computer readable program instructions thereon for causing a processor to carry out aspects of the present invention.

The computer readable storage medium can be a tangible device that can retain and store instructions for use by an instruction execution device. The computer readable storage medium may be, for example, but is not limited to, an electronic storage device, a magnetic storage device, an optical storage device, an electromagnetic storage device, a semiconductor storage device, or any suitable combination of the foregoing. A non-exhaustive list of more specific examples of the computer readable storage medium includes the following: a portable computer diskette, a hard disk, a random access memory (RAM), a read-only memory (ROM), an erasable programmable read-only memory (EPROM or Flash memory), a static random access memory (SRAM), a portable compact disc read-only memory (CD-ROM), a digital versatile disk (DVD), a memory stick, a floppy disk, a mechanically encoded device such as punch-cards or raised structures in a groove having instructions recorded thereon, and any suitable combination of the foregoing. A computer readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire.

Computer readable program instructions described herein can be downloaded to respective computing/processing devices from a computer readable storage medium or to an external computer or external storage device via a network, for example, the Internet, a local area network, a wide area network and/or a wireless network. The network may comprise copper transmission cables, optical transmission fibers, wireless transmission, routers, firewalls, switches, gateway computers and/or edge servers. A network adapter card or network interface in each computing/processing device receives computer readable program instructions from the network and forwards the computer readable program instructions for storage in a computer readable storage medium within the respective computing/processing device.

Computer readable program instructions for carrying out operations of the present invention may be assembler instructions, instruction-set-architecture (ISA) instructions, machine instructions, machine dependent instructions, microcode, firmware instructions, state-setting data, or either source code or object code written in any combination of one or more programming languages, including an object oriented programming language such as Java, Smalltalk, C++ or the like, and conventional procedural programming languages, such as the "C" programming language or similar programming languages. The computer readable program instructions may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider). In some embodiments, electronic circuitry including, for example, programmable logic circuitry, field-programmable gate arrays (FPGA), or programmable logic arrays (PLA) may execute the computer readable program instructions by utilizing state information of the computer readable program instructions to personalize the electronic circuitry, in order to perform aspects of the present invention.

Aspects of the present invention are described herein with reference to flowchart illustrations and/or block diagrams of methods, apparatus (systems), and computer program products according to embodiments of the invention. It will be understood that each block of the flowchart illustrations and/or block diagrams, and combinations of blocks in the flowchart illustrations and/or block diagrams, can be implemented by computer readable program instructions.

These computer readable program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks. These computer readable program instructions may also be stored in a computer readable storage medium that can direct a computer, a programmable data processing apparatus, and/or other devices to function in a particular manner, such that the computer readable storage medium having instructions stored therein comprises an article of manufacture including instructions which implement aspects of the function/act specified in the flowchart and/or block diagram block or blocks.

The computer readable program instructions may also be loaded onto a computer, other programmable data processing apparatus, or other device to cause a series of operational steps to be performed on the computer, other programmable apparatus or other device to produce a computer implemented process, such that the instructions which execute on the computer, other programmable apparatus, or other device implement the functions/acts specified in the flowchart and/or block diagram block or blocks.

The flowchart and block diagrams in the Figures illustrate the architecture, functionality, and operation of possible implementations of systems, methods, and computer program products according to various embodiments of the present invention. In this regard, each block in the flowchart or block diagrams may represent a module, segment, or portion of instructions, which comprises one or more executable instructions for implementing the specified logical function(s). In some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:
1. A computer-implemented method comprising:
  detecting one or more memory modules coupled to a memory controller via a memory channel;
  determining a total power requirement for the one or more memory modules on the memory channel;

adjusting a voltage regulator module set point of the memory channel based at least in part on the power requirement for the one or more memory modules, the voltage regulator module providing power to the one or more memory modules on the channel and characterized by an optimal load current value where the voltage regulator module operates at a peak efficiency;

determining an operating mode of the memory controller; and based at least in part on determining that the memory controller is operating in a first mode, throttling commands serviced by the one or more memory modules to keep a load current of the memory channel within a range of the optimal load current value, the throttling performed by the memory controller.

2. The computer-implemented method of claim 1, further comprising based at least in part on determining that the memory controller is operating in a second mode, not throttling commands serviced by the one or more memory modules.

3. The computer-implemented method of claim 2, wherein the second mode is a high performance mode.

4. The computer-implemented method of claim 1, further comprising sampling traffic on the memory channel, wherein the determining an operating mode is based at least in part on results of the sampling.

5. The computer-implemented method of claim 1, wherein the first operating mode is a voltage regulator efficiency mode.

6. The computer-implemented method of claim 1, wherein the detecting, determining a total power requirement, and adjusting are performed during an initial program load (IPL) of the system.

7. The computer-implemented method of claim 1, wherein the detecting one or more memory modules coupled to a memory controller comprises reading vital product data (VPD).

8. A system comprising:

a memory having computer readable instructions; and one or more processing units for executing the computer readable instructions, the computer readable instructions controlling the one or more processing units to perform operations comprising:

detecting one or more memory modules coupled to a memory controller via a memory channel;

determining a total power requirement for the one or more memory modules on the memory channel;

adjusting a voltage regulator module set point of the memory channel based at least in part on the power requirement for the one or more memory modules, the voltage regulator module providing power to the one or more memory modules on the channel and characterized by an optimal load current value where the voltage regulator module operates at a peak efficiency;

determining an operating mode of the memory controller; and based at least in part on determining that the memory controller is operating in a first mode, throttling commands serviced by the one or more memory modules to keep a load current of the memory channel within a range of the optimal load current value, the throttling performed by the memory controller.

9. The system of claim 8, wherein the operations further comprise:

based at least in part on determining that the memory controller is operating in a second mode, not throttling commands serviced by the one or more memory modules.

10. The system of claim 9, wherein the second mode is a high performance mode.

11. The system of claim 8, wherein the operations further comprise:

sampling traffic on the memory channel, wherein the determining an operating mode is based at least in part on results of the sampling.

12. The system of claim 8, wherein the first operating mode is a voltage regulator efficiency mode.

13. The system of claim 8, wherein the detecting, determining a total power requirement, and adjusting are performed during an initial program load (IPL) of the system.

14. The system of claim 8, wherein the detecting one or more memory modules coupled to a memory controller comprises reading vital product data (VPD).

15. A computer program product comprising a computer readable storage medium having program instructions embodied therewith, the program instructions executable by one or more processing units to cause the processing units to perform operations comprising:

detecting one or more memory modules coupled to a memory controller via a memory channel;

determining a total power requirement for the one or more memory modules on the memory channel;

adjusting a voltage regulator module set point of the memory channel based at least in part on the power requirement for the one or more memory modules, the voltage regulator module providing power to the one or more memory modules on the channel and characterized by an optimal load current value where the voltage regulator module operates at a peak efficiency;

determining an operating mode of the memory controller; and based at least in part on determining that the memory controller is operating in a first mode, throttling commands serviced by the one or more memory modules to keep a load current of the memory channel within a range of the optimal load current value, the throttling performed by the memory controller.

16. The computer program product of claim 15, wherein the operations further comprise:

based at least in part on determining that the memory controller is operating in a second mode, not throttling commands serviced by the one or more memory modules.

17. The computer program product of claim 16, wherein the second mode is a high performance mode.

18. The computer program product of claim 15, wherein the operations further comprise:

sampling traffic on the memory channel, wherein the determining an operating mode is based at least in part on results of the sampling.

19. The computer program product of claim 15, wherein the first operating mode is a voltage regulator efficiency mode.

20. The computer program product of claim 15, wherein the detecting, determining a total power requirement, and adjusting are performed during an initial program load (IPL) of the system.

* * * * *